United States Patent [19]
Miyagi et al.

[11] Patent Number: 5,422,081
[45] Date of Patent: Jun. 6, 1995

[54] TRAP DEVICE FOR VAPOR PHASE REACTION APPARATUS

[75] Inventors: Katsushin Miyagi, Sagamihara; Osamu Yokokawa, Kanagawa; Yoshitaka Okada, Sagamihara; Ichiro Nagasaki; Akira Hashimoto, both of Yokohama, all of Japan

[73] Assignees: Tokyo Electron Kabushiki Kaisha, Tokyo; Tokyo Electron Tohoku Kabushiki Kaisha, Esashi; Cuno K.K., Yokohama, all of Japan

[21] Appl. No.: 155,750

[22] Filed: Nov. 23, 1993

[30] Foreign Application Priority Data

Nov. 25, 1992 [JP] Japan .................................. 4-314878

[51] Int. Cl.⁶ ............................................. B01D 8/00
[52] U.S. Cl. ....................................... 422/170; 55/484; 55/486; 55/488; 96/121; 422/168; 422/169; 422/173
[58] Field of Search ............... 422/168, 484, 486, 488, 422/170, 169, 173; 55/484, 486, 488; 96/121

[56] References Cited
U.S. PATENT DOCUMENTS 5,141,714  8/1992  Obuchi et al. ................. 422/174

FOREIGN PATENT DOCUMENTS

| 1-218013 | 8/1989 | Japan . |
| 1-318231 | 12/1989 | Japan . |
| 2-9408 | 1/1990 | Japan . |
| 2-25573 | 1/1990 | Japan . |
| 2-59002 | 2/1990 | Japan . |
| 2-61067 | 3/1990 | Japan . |
| 2-111403 | 4/1990 | Japan . |
| 4-150903 | 5/1992 | Japan . |

Primary Examiner—Amalia L. Santiago
Attorney, Agent, or Firm—Beveridge, DeGrandi, Weilacher & Young

[57] ABSTRACT

A double cylinder shaped multilayer structural member comprising ring shaped thin plate small diameter discs and large diameter discs respectively layered via spacers is disposed in the enclosure vessel of a trap device for a vapor phase reaction apparatus. Gas from the intake opening section of the enclosure vessel is introduced into the outer side space of the multilayer structural member of the enclosure vessel, passes through the spaces between the large diameter discs and also passes through the spaces between the small diameter discs, then exits via the inner side space of the multilayer structural member from the outlet opening section of enclosure vessel to the system exterior. As a result of this construction, in comparison to conventional devices, the collection efficiency of reactive components can be increased, the equipment life extended, and maintenance frequency reduced, thereby providing a trap device for a vapor phase reaction apparatus capable of improving productivity.

17 Claims, 12 Drawing Sheets

TRAP DEVICE FOR VAPOR PHASE REACTION APPARATUS

BACKGROUND OF THE INVENTION

The present invention relates to a trap device for a vapor phase reaction apparatus.

For example, in the case of a vapor phase reaction apparatus such as a CVD apparatus used in a semiconductor device manufacturing process, treatment gas for forming a CVD film on a semiconductor wafer is included in the exhaust gas. For this reason, various types of trap devices for vapor phase reaction apparatuses have been used in previous years whereby this kind of treatment gas is trapped and guided to a vacuum pump for vacuum exhaust, in order to decrease the treatment gas induced thereinto.

An example of the many conventional designs for trap devices for a vapor phase reaction apparatus is disclosed by JP 62-20841, wherein a cooling mechanism is provided in a hermetic vessel and members such as baffle plates are arranged in series in the hermetic vessel. When the exhaust gas strikes these, the gas flow route is lengthened and the cooling efficiency is increased, thereby improving the treatment gas collection efficiency.

However, even in the case of the above mentioned example of a conventional trap device for a vapor phase reaction apparatus, the treatment gas collecting efficiency cannot be termed adequate. For this reason, development of a trap device for a vapor phase reaction apparatus has been sought that can provide increased collecting efficiency, extended operating life of the device and reduced maintenance frequency, and as a result can improve the productivity of semiconductor wafers and other products.

SUMMARY OF THE INVENTION

The present invention relates to a trap device for a vapor phase reaction apparatus that has the objects of resolving the problems affecting conventional trap devices, and in comparison, raise the treatment gas collecting efficiency, extend the operating life of the device, reduce maintenance frequency, and as a result achieve improved semiconductor wafer productivity.

Therefore, a trap device for a vapor phase reaction apparatus in accordance with this invention comprises an enclosure vessel forming a hermetic seal, a gas route formed of a plurality of plate shaped members arranged in layers and provided with spaces, a multilayer structural member arranged in the enclosure vessel so as to partition the enclosure vessel into predetermined spaces, a gas introducing section for introducing gas into one space partitioned by the structural member of the enclosure vessel, and a gas removing section for removing gas from the other space partitioned by the structural member of the enclosure vessel.

Studies by the inventor and others regarding collection of reactive components in a CVD apparatus exhaust gas have shown that during treatment gas inflow to the trap device, reactive components adhere and are concentrated in the trap section first struck by the reaction gas and in other contacted sections due to scattering effects.

In the case of the trap device for a vapor phase reaction apparatus in accordance with this invention, a plurality of plate shaped members are arranged in layers in the vertical direction in the enclosure vessel to provide spaces, comprising a multilayered structural member. Impact and scattering effects produced by exhaust gas flow in the spaces of this multilayered structural member are effectively utilized so that reactive components adhere to the plate shaped member surfaces and the treatment gas is collected. As a result, the collection efficiency is increased in comparison to conventional devices.

DETAILED DESCRIPTION OF THE PREFERRED EMBODIMENTS

Following is a description of the preferred embodiments of a trap device for a vapor phase reaction apparatus in accordance with this invention with reference to the attached drawings.

Figure 1:
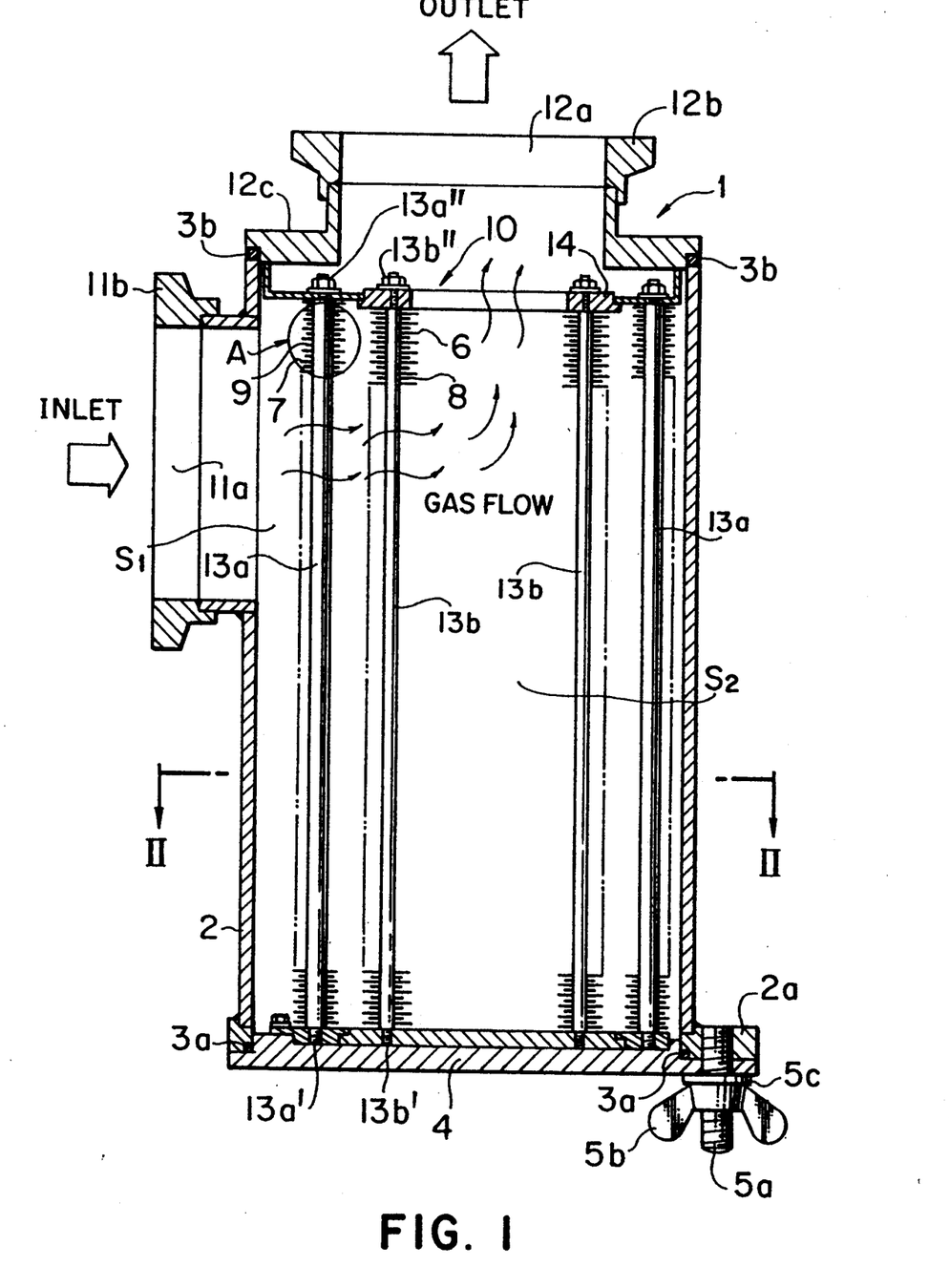
FIG. 1 is a vertical cross section drawing along perspective I—I of FIG. 2 of a first embodiment of this invention as a trap device for a vapor phase reaction apparatus.
Figure 2:
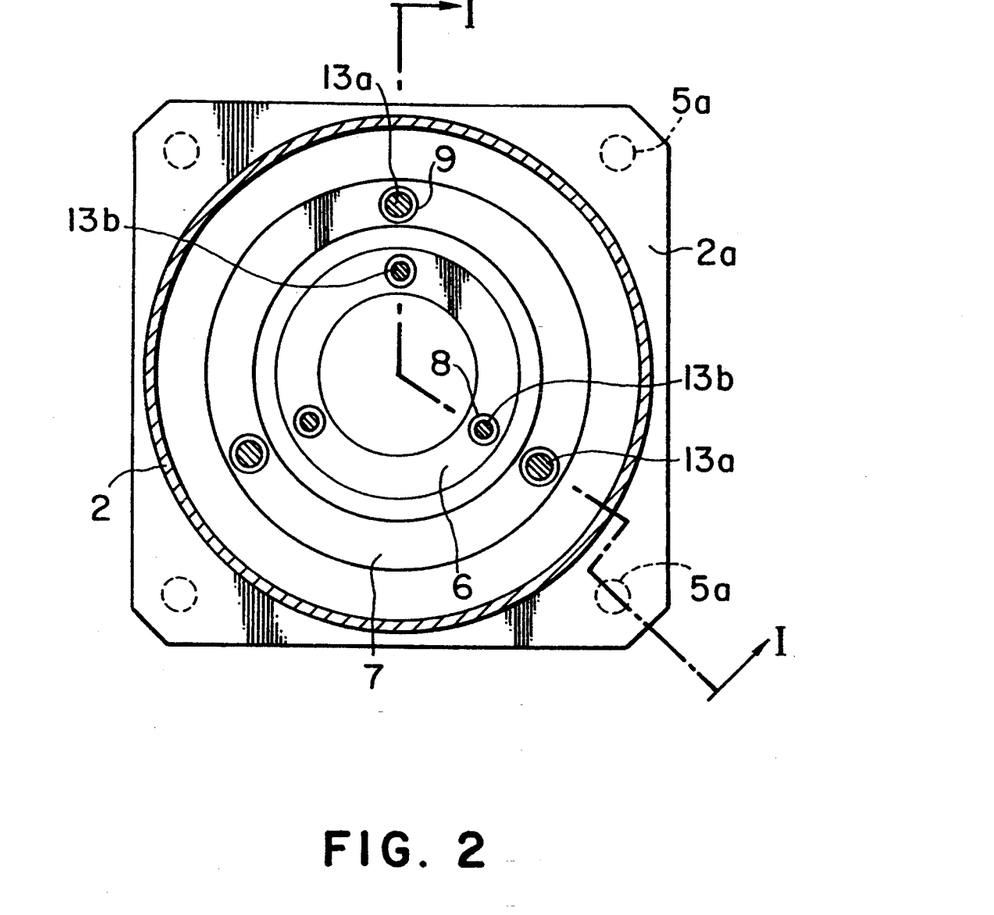
FIG. 2 is a view of the trap device along perspective II—II of FIG. 1.

As indicated in FIGS. 1 and 2, a trap device 1 for a vapor phase reaction apparatus in accordance with a first embodiment comprises a cylindrical shaped enclosure vessel 2 made of stainless steel or aluminum and constructed so as to allow hermetically sealing the interior. At the bottom square shaped flange 2a of this enclosure vessel 2, a freely opening and closing cover 4 is secured via an O-ring 3a for hermetic sealing by a screw 5b anchored to the flange 2a by a bolt 5a and a washer 5c.

At the upper side wall of the enclosure vessel 2, a gas introducing tube 11b having a stainless steel or aluminum intake opening section 11a is affixed by such means as welding. A gas outflow tube 12b of stainless steel or aluminum having an output opening section 12a at the upper part of the enclosure vessel 2 is affixed via an O-ring 3b by a screw or other suitable means for maintaining hermetic sealing.

Also in the enclosure 2, stainless steel or aluminum ring shaped small diameter discs 6 (for example 57 mm outer diameter, 52 mm inner diameter) and large diameter discs 7 (for example 119 mm outer diameter, 94 mm inner diameter) are provided, the discs 6 and 7 comprising thin plates of thickness for example 0.1-1.0 mm, with 0.5 mm, preferred, respectively separated by, for example 6-7 mm diameter spacers 8 and 9, to form a multilayer of for example 150 discs and arranged to comprise a double cylinder type multilayer structural member 10.

Gas (exhaust gas) is introduced from the intake opening section 11 at the outer side of the multilayer structural member 10. The gas is removed via the output opening section 12 at the inner side of the multilayer structural member 10. Also, it is acceptable to provide tapers on both sides of the small and large diameter discs 6 and 7.

Figure 3:
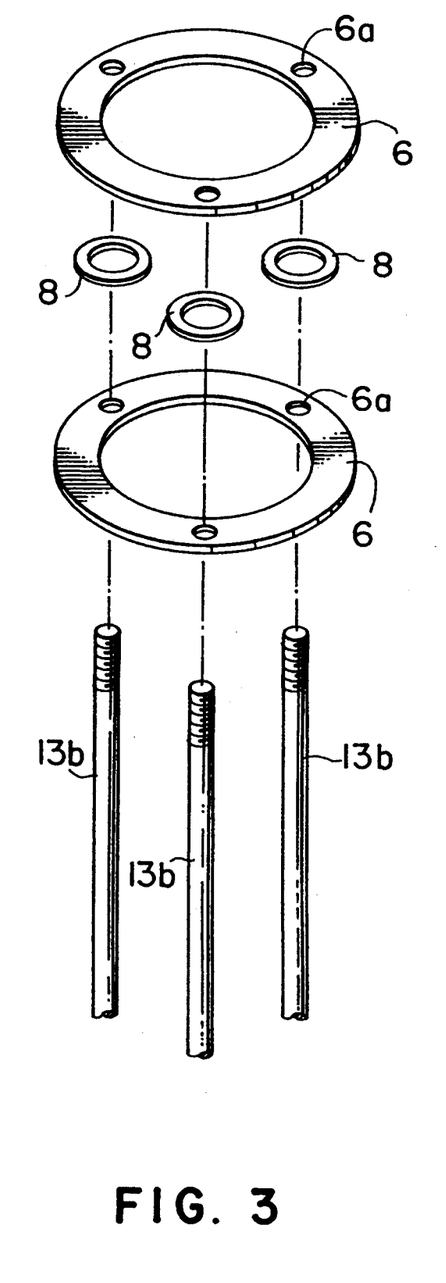
FIG. 3 is an exploded view of a small diameter disc and its mounting structure for the trap device indicated in FIG. 1.

In the multilayer structural member 10, as indicated in FIG. 3, rods 13b (for example 3 rods each 4 mm diameter) anchored to the cover 4 alternately pass through the small diameter disc 6 holes 6a and predetermined thickness spacers 8. Between these small diameter discs 6, spaces are respectively formed according to the thickness of the spacers 8, thus forming a cylindrical structure of for example 150 layers.

In the same manner, the large diameter discs 7 and spacers 9 are multilayered with rods 13a as supporting members. The upper ends of rods 13a and 13b are respectively affixed by screws 13a" and 13b" to a top plate 14 having a central opening section, forming a concentrically arranged cylindrical member. In this case, alternately arranging adjacent small and large diameter discs 6 and 7, horizontally in the vertical direction or a mutually interlocking or staggered arrangement is also acceptable.

Also, as shown in FIG. 1, hermetic sealing is used between the top and bottom ends of the multilayer structural member 10 and the inner wall of the enclosure vessel 2. The gas (e.g., exhaust gas) introduced from the intake opening section 11 to the outer side of the multilayer structural member 10 of the enclosure vessel 2 passes through the axial direction spaces G (see FIG. 5) between the large diameter discs 7, and in addition, passes through the spaces between the small diameter discs 6, then is removed from the multilayer structural member 10 to the outlet opening section 12.

Figure 4:
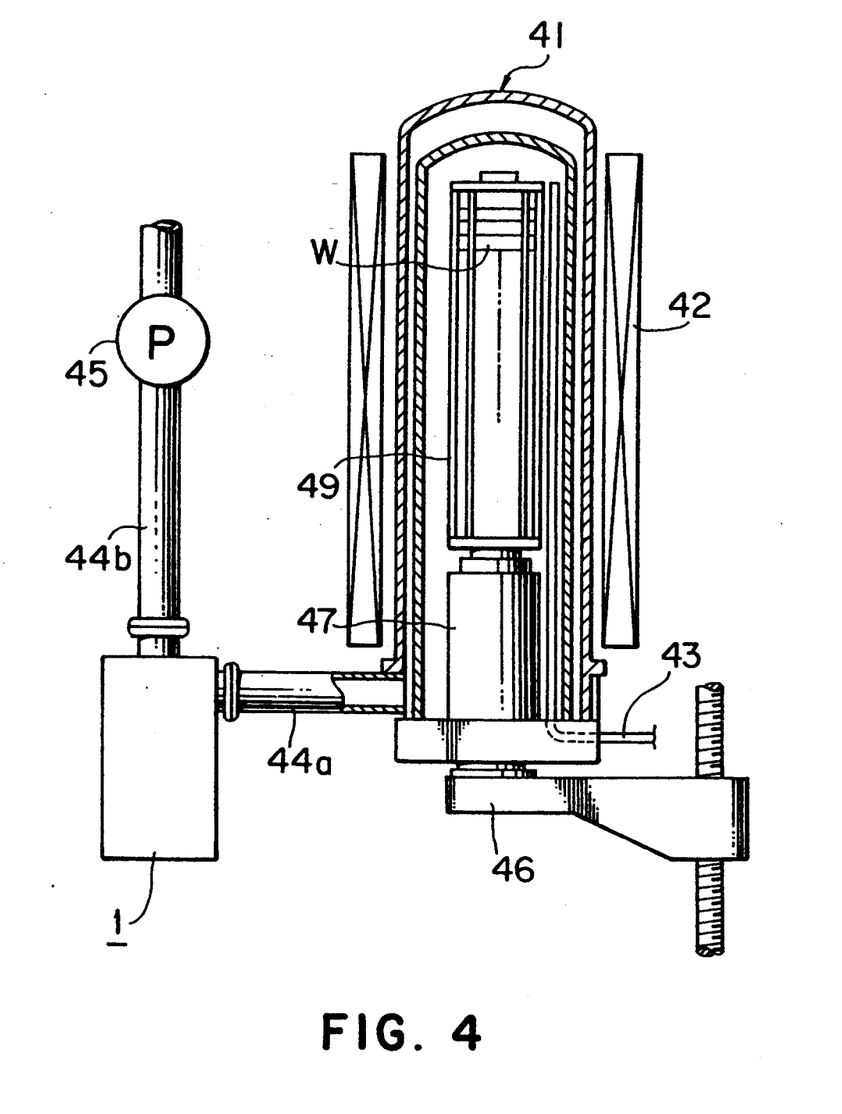
FIG. 4 is an abbreviated drawing of a vertical CVD apparatus provided with the trap device for a chemical vapor deposition apparatus of this invention.

A trap device 1 for a vapor phase reaction apparatus constructed in accordance with this embodiment can be provided in the exhaust system of for example a vertical type CVD apparatus such as indicated in FIG. 4.

A typical vertical type CVD apparatus comprises, for example, a cylindrical shaped process tube 41 of quartz or other material disposed essentially vertically. This process tube 41 is enclosed by a cylindrical shaped heater 42 and insulator material. A treatment gas inducing tube 43 and exhaust tubes 44a and 44b are respectively connected at the top and bottom portions of this process tube 41 in order to induce and exhaust a predetermined treatment gas. The intake introducing section 11b and outlet removal section 12b of the trap device 1 for a vapor phase reaction apparatus are respectively connected by connecting means to these exhaust tubes 44a and 44b, and a vacuum pump 45 is connected to the trap device 1.

In addition, a vertically movable boat elevator 46 is provided at the lower direction of the process tube 41 as a wafer boat 49 transport mechanism. A temperature holding tube 47 is provided for this boat elevator 46. This temperature holding tube 47 is capable of supporting the wafer boat 49 loaded with a plurality of semiconductor wafers W in the vertical direction.

This boat elevator 46 loads and unloads the wafer boat 49 containing the semiconductor wafers W via the bottom section opening of the process tube 41. FIG. 4 shows the state when the wafer boat 49 is loaded in the process tube 41.

In the case of a vertical CVD apparatus having the above mentioned construction, the process tube 41 interior is heated to a predetermined temperature, for example 700–1000 degrees C., by the heater 42, and the semiconductor wafers W stored in the wafer boat 49 are raised by the boat elevator 46 and loaded in the process tube 41. A predetermined treatment gas is introduced into the process tube 41 from the treatment gas introducing tube 43. The treatment gas flows in the process tube 41 and a CVD film is formed on the semiconductor wafer W surfaces. Thereafter, the post treatment gas from the exhaust tube 44 is sent as the exhaust gas by the vacuum pump 45 to the factory exhaust system.

At this time, the exhaust gas flowing in the exhaust tube 44a includes gas that did not undergo reaction in the process tube 41. This exhaust gas, as shown in FIG. 1, flows from the intake opening section 11a of the trap device 1 for a vapor phase reaction apparatus into the outer space S1 of the multilayer structural member 10 in the enclosure vessel 2.

The exhaust gas flows in the vertical direction spaces between the large diameter discs 7, and also through the spaces between the small diameter discs 6, then from the internal space S2 of the multilayer structural member 10 to the outlet opening section 12. In this route, when the exhaust gas passes through the spaces G between the large diameter discs 7, due to the impact and scattering effects of the large diameter discs 7, a response is produced and reactive components adhere to the large diameter disc 7 surfaces (outer circumference and both faces). In addition, when the exhaust gas passes through the spaces between the small diameter discs 6, unreacted gas in the exhaust gas is collected and removed.

When reactive components are not adhered to the surface of the outer and inner discs 7 and 6, as shown in FIG. 1, such as right after maintenance of the multilayer structural member 10 which is attached to the interior of the enclosure vessel 2, the major portion of the the exhaust gas from the intake opening section 11a flowing into the enclosure vessel 2 passes through the space portion near the multilayer structural member 10 intake opening section 11a and leaves toward the output opening section 12a.

Figure 5:
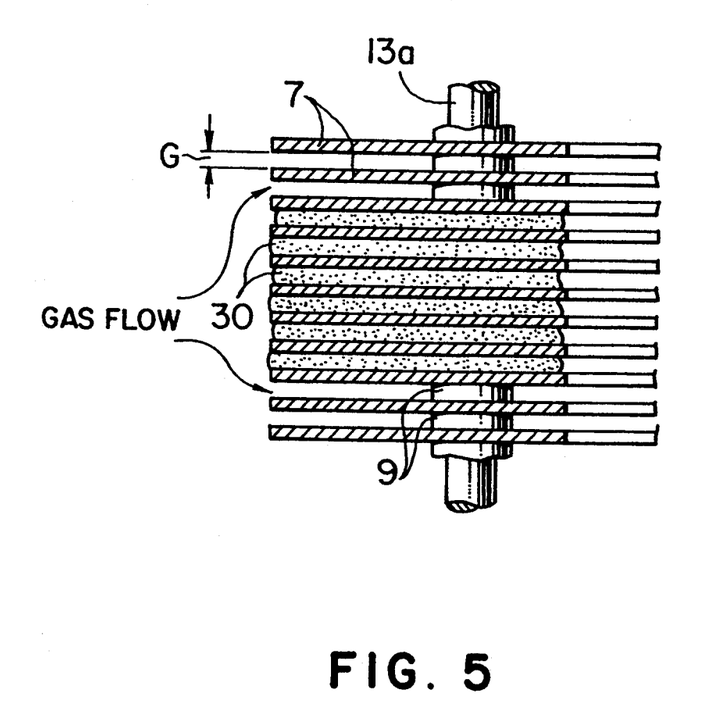
FIG. 5 is an enlarged drawing of section A in FIG. 1 indicating the closed state with reactive components adhering between large diameter discs.

After the elapse of time, reactive components adhere in the gas flow portion (spaces) of the multilayer structural member 10, as indicated in FIG. 5. Spaces G between the large diameter discs 7 (and the spaces between the small diameter discs 6) become closed by reactive components 30 and the conductance of this section diminishes. As indicated by the arrows in FIG. 5, the exhaust gas in the enclosure vessel 2 flows through the unclosed spaces G at the periphery of the closed portion.

As a result, the exhaust gas flow through the multilayer structural member 10 gradually changes due to reactive component adherence and eventually reactive components adhere to all the discs 6 and 7 of the multilayer structural member 10. Consequently, the entire area of the multilayer structural member 10 can be effectively utilized and by maintaining a fixed collecting capability status, the usage period can be determined in accordance with the size of the multilayer structural member 10 (surface area).

For this reason, for example, by setting the size of the multilayer structural member 10 to match the maintenance period of other vertical CVD apparatus components, the collecting capability can be maintained for a fixed period.

During actual measurements of the collection efficiency of a trap device in accordance with this embodiment when used with a CVD apparatus having the above mentioned construction for SiN film formation on semiconductor wafer surfaces using $SiH_2Cl_2$ (flow amount 100 SSCM) and $NH_3$ (flow amount 1000 SCCM) treatment gasses, the results indicated 70 percent. Compared with the 50 percent collection efficiency of a conventional trap device, a high collection efficiency was confirmed. Also, as mentioned above, according to the usage time, the gradual adherence of reactive components in the overall multilayer structural member was confirmed.

Also, if the spaces G respectively between the large and small diameter discs 7 and 6 are too narrow, the reduced conductance is undesirable in terms of exhaust efficiency. Conversely, if too wide, the collection efficiency is reduced. For this reason, as a result of repeated tests of changing the size of the spaces G, by using a range of 0.1–1 mm with a preferred range of 0.3–0.6 mm, collection effectiveness on a practical level was obtainable without sharp reduction of conductance.

The following is a description of another embodiment of this invention as a trap device for a vapor phase reaction apparatus.

Figure 6:
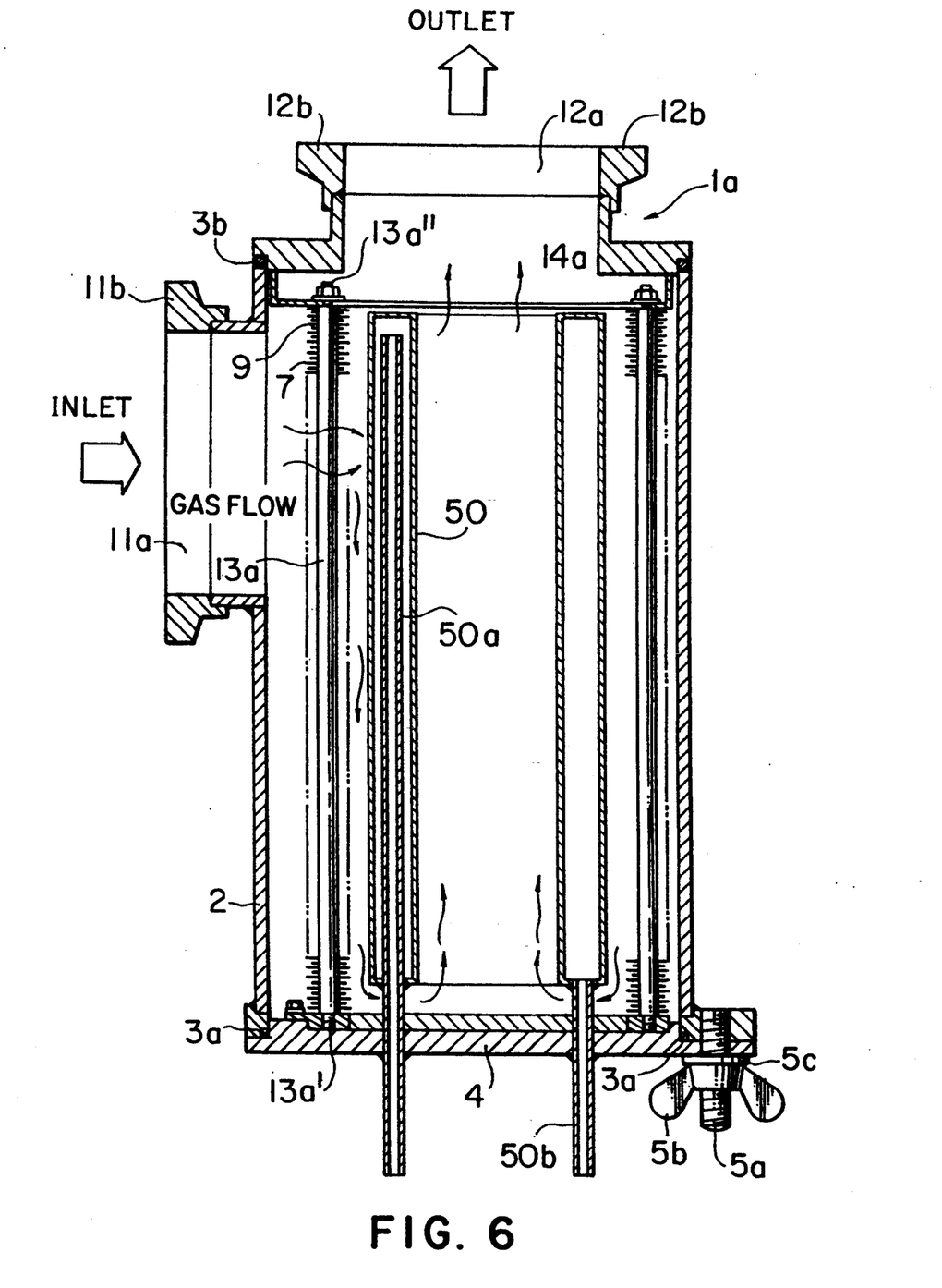
FIG. 6 is a vertical cross section drawing of a second embodiment of this invention as a trap device for a chemical vapor deposition apparatus.

In the trap device for a vapor phase reaction apparatus as shown in FIG. 6, rods 13a are anchored to the cover means 4 and secured at the top by a top plate 14a at the inner side of the large diameter discs 7. In place of the small diameter discs 6, a cylindrical shaped cooling medium circulating mechanism 50 comprising a mechanism capable of circulating a cooling medium etc. is provided on the inside. The cooling medium is supplied from an input tube 50a, and after cooling the gas is exhausted from output tube 50b.

In the case of this embodiment, there is hermetic sealing between the cooling medium circulating mechanism 50 top end and the enclosure vessel 2 inner wall. The gas (exhaust gas) introduced from the intake opening section 11a to the enclosure vessel 2 passes through the spaces between the large diameter discs 7, temporarily drops downward along the outer side of the cooling medium circulator mechanism 50 tube, passes between the cooling medium circulator mechanism 50 bottom end and the cover 4 and enters the inner side of the cooling medium circulating mechanism inner tube where it rises, then exits from the outlet opening section 12a to the system exterior. This type of cooling is particularly effective when the treatment gas is ammonium chloride ($NH_4Cl$) and tetraethoxipilane (TEOS). In the case of this type trap device 1a for a vapor phase reaction apparatus, according to the type of reactive components, the collecting effectiveness can be further increased by cooling.

Figure 7:
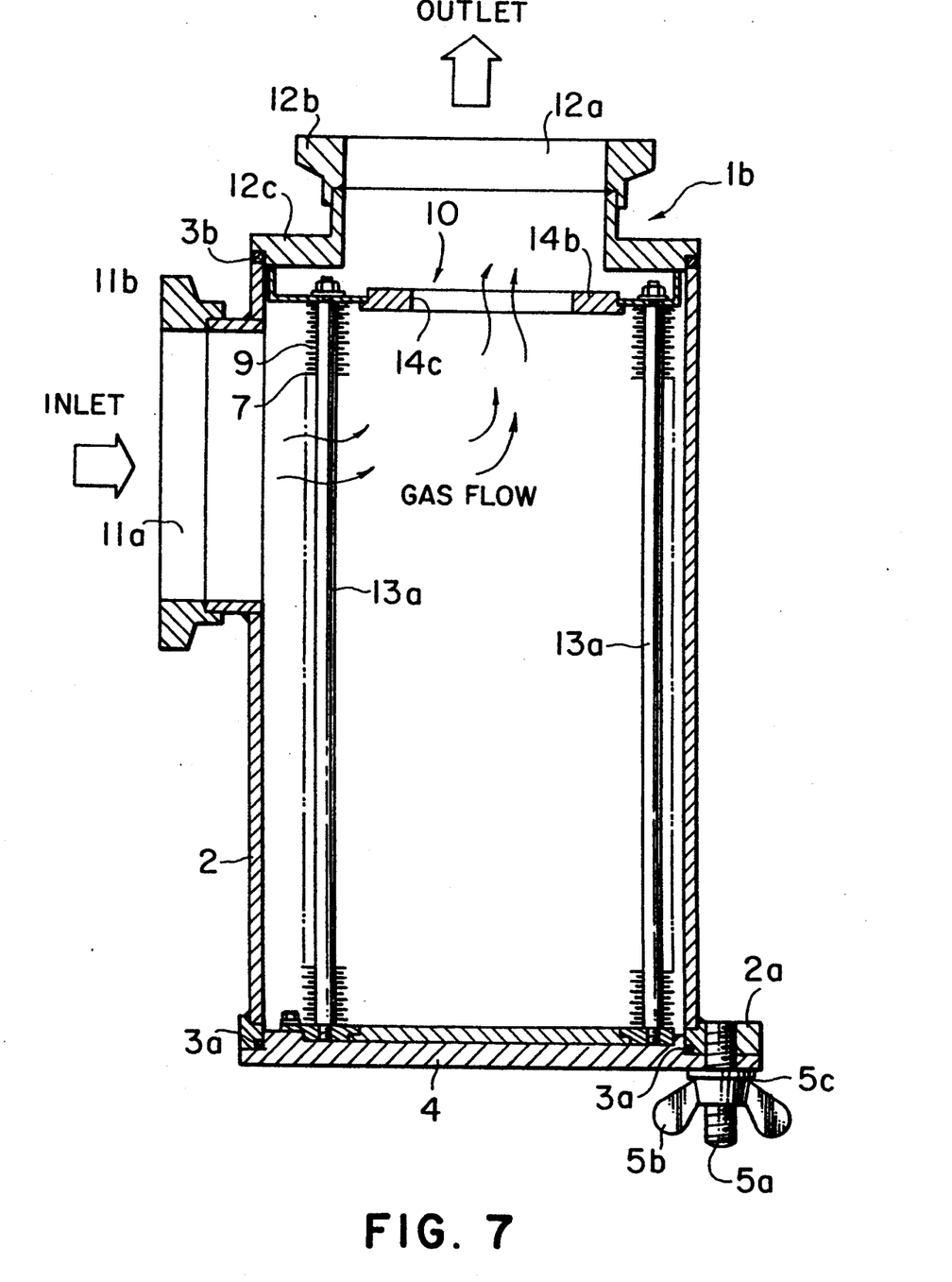
FIG. 7 is a vertical cross section drawing of a third embodiment of this invention as a trap device for a chemical vapor deposition apparatus.

The trap device 1b for a vapor phase reaction apparatus as shown in FIG. 7 is an embodiment whereby the multilayer structural member 10 is comprised without using the small diameter discs 6 but only the large diameter discs 7. According to tests, in the case of the trap device embodiment indicated in FIG. 1, since most of the reactive components adhere to the large diameter disc surfaces, in this manner, even with a multilayer structural member 10 comprising a single layer of large diameter discs 7, without major reduction of collecting efficiency, construction can be simplified and construction cost reduced.

Figure 8:
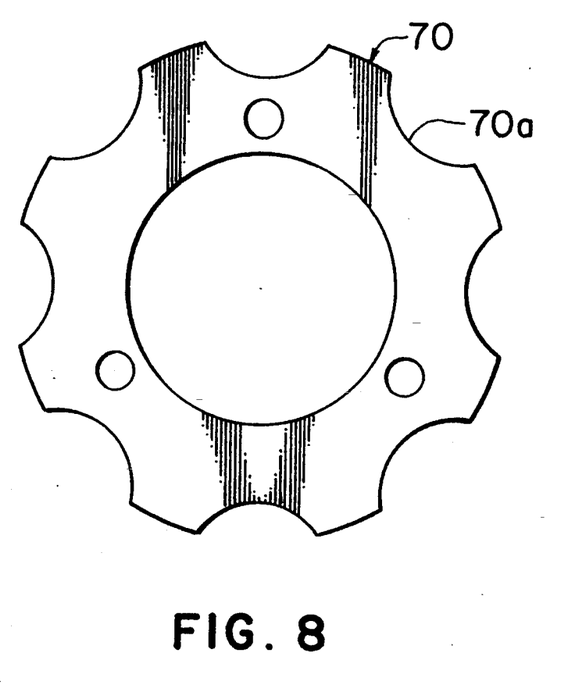
FIG. 8 is a plane view of another embodiment of the multilayer structural member disc used with the trap device for a vapor phase reaction apparatus of this invention.

Also, since reactive components tend to adhere easily to the outer edges of the discs, in order to increase the treatment gas contact surface area of the multilayer structural member 10, a ring shaped disc 70 having notches such as 70a formed in the outer circumference can be used as indicated in FIG. 8. The notches 70a can also be in the form of pleats.

Figure 9:
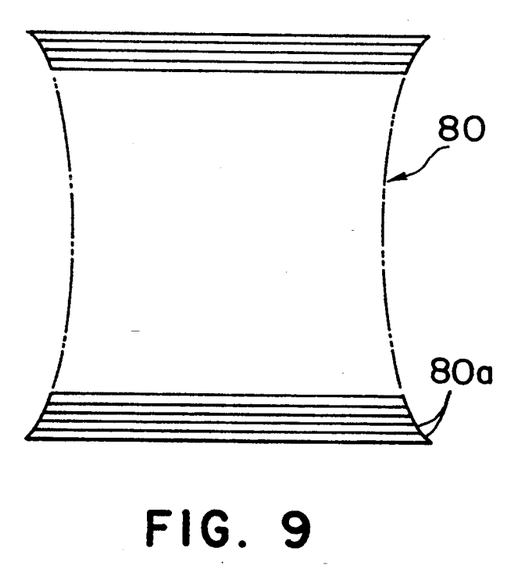
FIG. 9 is a lateral view of another embodiment of the multilayer structural member disc used with the trap device for a vapor phase reaction apparatus of this invention.

As shown in FIG. 9, by layering different diameter discs 80a, a multilayer structural member 80 can be assembled in a drum type form.

Figure 10:
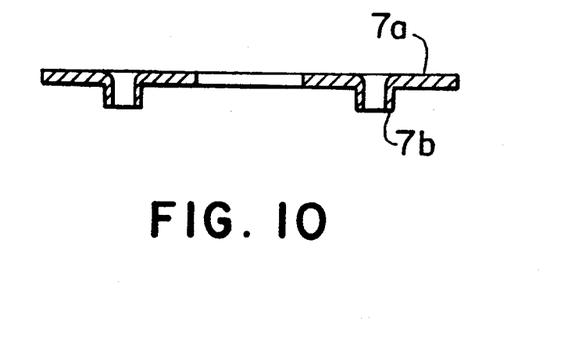
FIG. 10 is a vertical cross section view of still another embodiment of the multilayer structure member disc used with the trap device for a vapor phase reaction apparatus of this invention.
Figure 11:
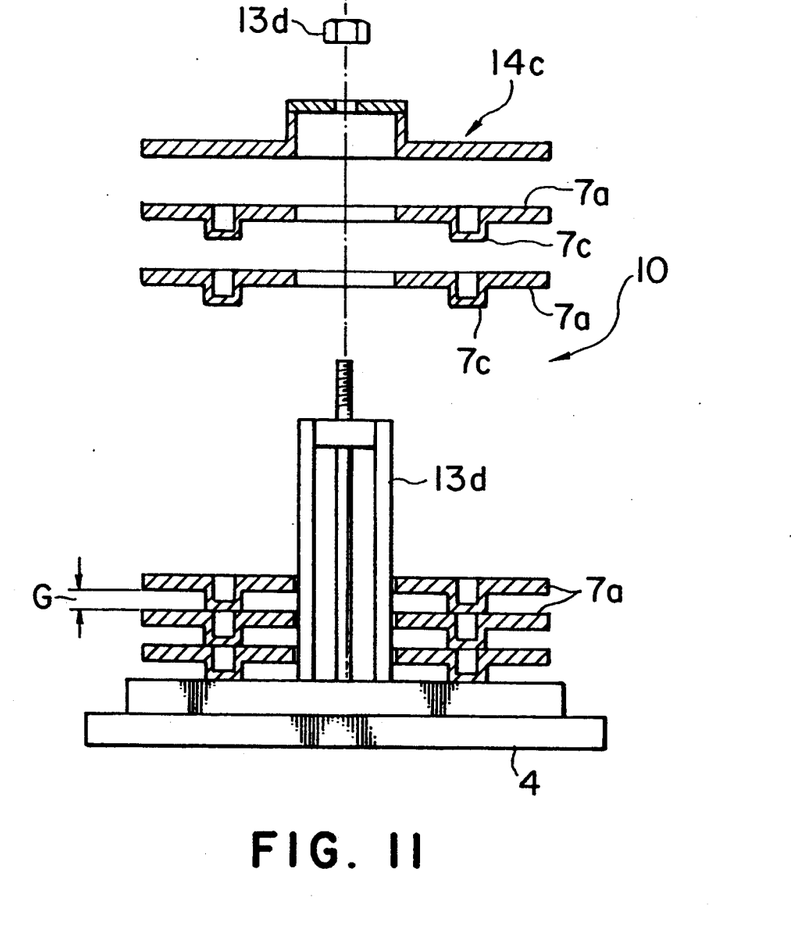
FIG. 11 is an exploded vertical cross section view of the assembled state of the disc shown in FIG. 10.
Figure 12:
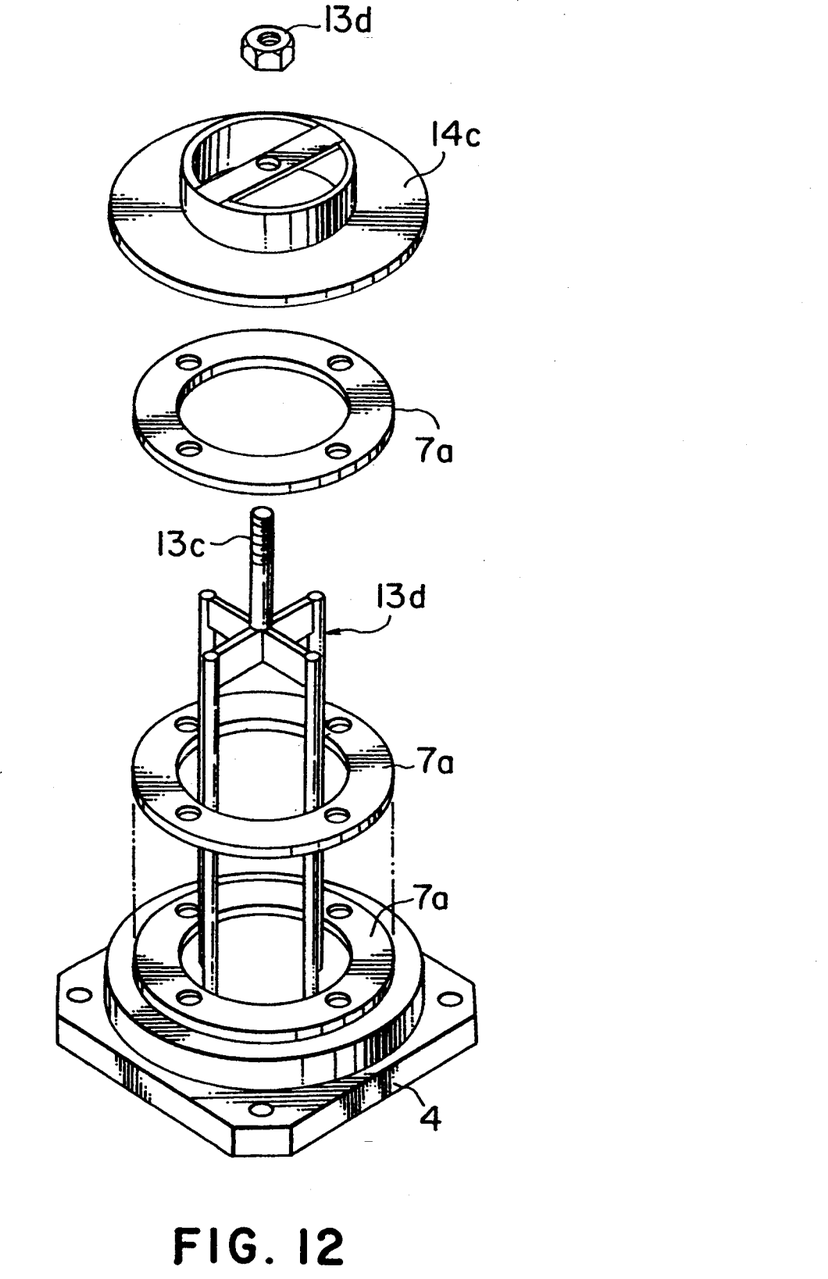
FIG. 12 is an exploded oblique view of the assembled disc state shown in FIG. 11.

Also, as shown in FIG. 10, when pressing the ring shaped plate member, a plurality of, for example, 3 projections 7b can be produced by embossing to form the disc 7a. As a result of this embodiment, in the case of layering the discs 7a to form the multilayer structural member, as shown in FIGS. 11 and 12, the disc 7a inner hole is guided by the supporting post 13d anchored to the cover 4. At the same time, protrusions 7b and 7c contact the next stage disc 7a, thereby mutually forming the spaces G without the use of spacers. Finally, a top cover 14c is secured by a nut 13d to the threaded section of the supporting post 13d to complete the multilayer structural member 10. By adopting this type of construction, positions of the disc 7a can be aligned easily without using a large number of spacers, disassembly and assembly are rendered very easy and accomplishable in a short time period.

Figure 13:
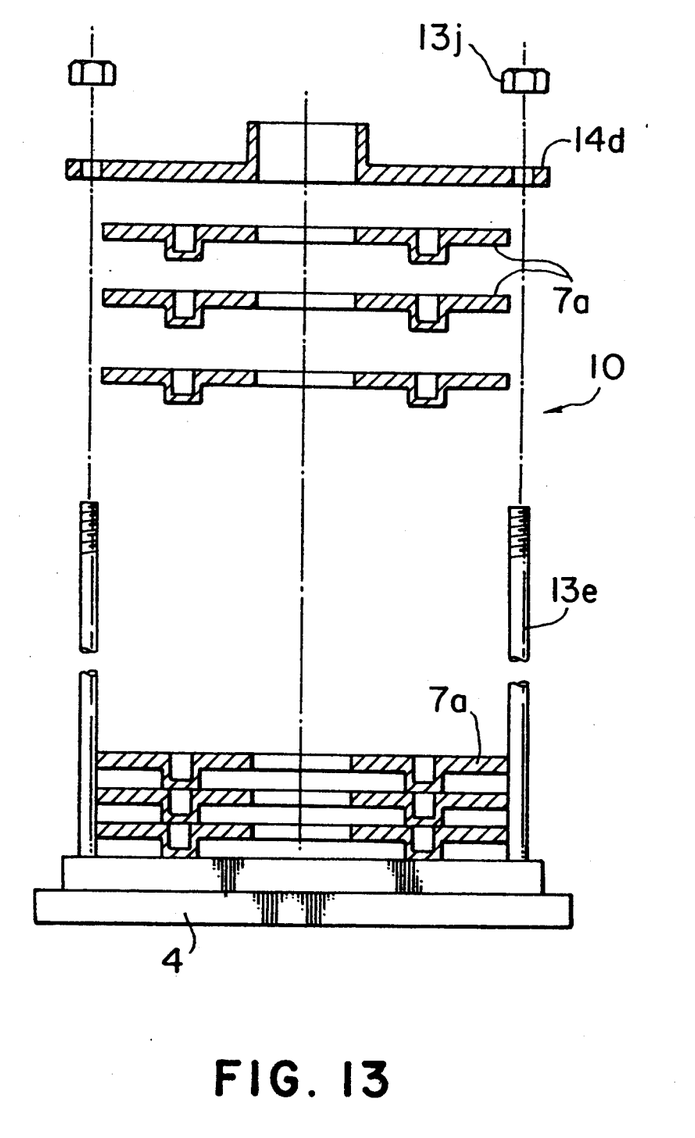
FIG. 13 is a vertical cross section view of another assembly method for the disc shown in FIG. 10.

In addition, as shown in FIG. 13, anchoring for example 3 guide rods 13e to the cover 4, and engaging the discs 7a with these guide rods 13e to form the multilayer structural member 10 is also acceptable.

Figure 14:
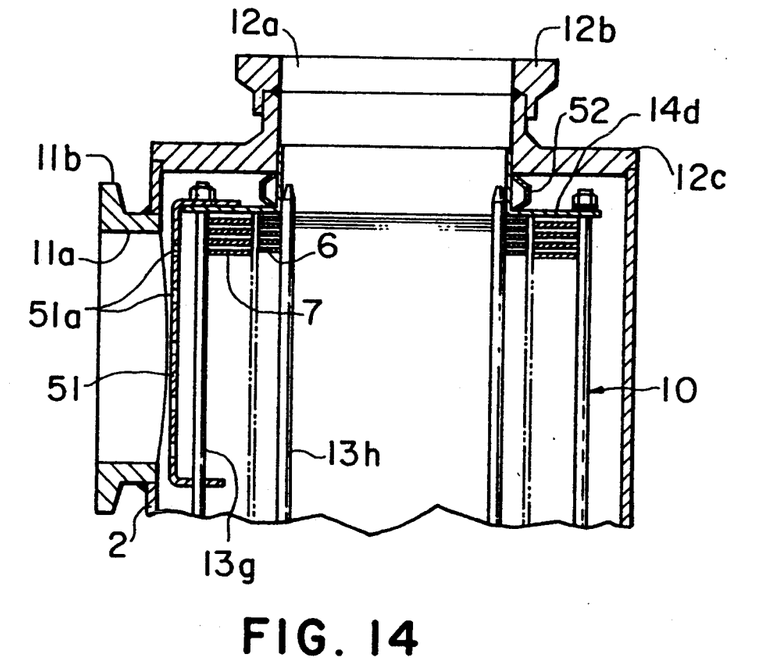
FIG. 14 is a vertical cross section view of the trap device section provided with a baffle plate containing small holes between the trap device intake opening section and the multilayer structural member and FIG. 15 is a partial broken plane view of the trap device shown in FIG. 14.
Figure 15:
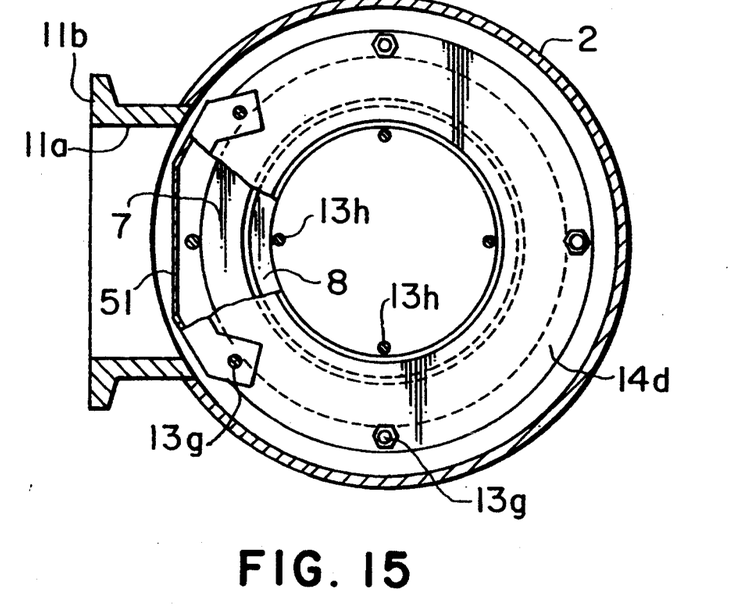

Also, as shown in FIGS. 14 and 15, a baffle plate 51 having a plurality of small holes 51a can be disposed between the intake opening 11a of the gas intake section 11b and the outer circumferences of the large diameter discs 7 of the multilayer member 10. Treatment gas collection can then be performed by the exhaust gas impact on this baffle plate 51 and reactive components adhering to the discs 6 and 7. In this case, a gasket is inserted between the top plate 14d and the gas outlet section flange 12c so as to maintain hermetic sealing of this section.

In the foregoing embodiments, this invention was described with reference to application to a vertical CVD apparatus. However, this invention is not limited to these embodiment examples and is also applicable to other types of CVD apparatus, as well as to other types of chemical vapor treatment apparatuses. Also, for example, the shape, construction and other parameters of the enclosure vessel 2, the multilayer structural member 10 and other sections can be rendered in numerous variations.

As described above, as a result of the trap device for a vapor phase reaction apparatus in accordance with this invention, in comparison to conventional devices, reactive component collection efficiency is higher, useful life of the device is extended, and maintenance frequency is reduced, thereby enabling improved productivity.

What is claimed is:

1. A trap device for a vapor phase reaction apparatus comprising:

a hermetically constructed enclosure vessel;

a multilayer structural member including a plurality of ring shaped plate members disposed in the enclosure vessel horizontally, the ring shaped plate members being disposed such that a plurality of ring shaped members are disposed in the vertical direction, and said multilayer structural member arranged so as to partition said enclosure vessel into an inner side space and an outer side space with respect to said ring shaped plate members;

a cooling means at the inner side space of said enclosure vessel;

a gas inlet opening for introducing gas into the outer side space of said enclosure vessel partitioned by said multilayer structural member; and a gas outlet opening for removing gas from the inner side space of said enclosure vessel partitioned by said multilayer structural member.

2. The trap device for a vapor phase reaction apparatus of claim 1 wherein:

said ring shaped plate members include discs having a first outer diameter size and discs having a second outer diameter size, wherein the second outer diameter size is larger than the first outer diameter size.

3. The trap device for a vapor please reaction apparatus of claim 1 wherein:

said ring shaped plate members include discs having a first outer diameter size and discs having a second outer diameter size, wherein the second outer diameter size is larger than the first outer diameter size; and wherein said discs having a first outer diameter size and said discs having a second outer diameter size are alternately arranged on the same vertical plane.

4. The trap device for a vapor phase reaction apparatus of claim 1 wherein:

said ring shaped plate members include discs having a first outer diameter size and discs having a second outer diameter size, wherein the second outer diameter size is larger than the first outer diameter size; and wherein said discs having a first outer diameter size and said discs having a second outer diameter size are arranged in staggered horizontal planes.

5. The trap device for a vapor phase reaction apparatus of claim 1 wherein:

both sides of said ring shaped plate members have tapered forms, and the ring shaped plate members are mounted on a rod.

6. The trap device for a vapor phase reaction apparatus of claim 1 wherein:

the ring shaped plate members are spaced apart by a distance of 0.1-1 mm.

7. The trap device for a vapor phase reaction apparatus of claim 1 wherein:

notches are formed in the outer circumferences of said ring shaped plate members.

8. The trap device for a vapor phase reaction apparatus of claim 1 wherein:

the diameters of said ring shaped plate members differ to produce an irregular outer circumference profile.

9. The trap device for a vapor phase reaction apparatus of claim 1 wherein:

said multilayer structural member includes a plurality of projection portions produced on said ring shaped plate members whereby said projection portions contact vertically adjacent ring shaped plate member.

10. The trap device for a vapor phase reaction apparatus of claim 1 wherein:

a baffle plate, including a plurality of small holes defined therein, is disposed between said gas intake opening and the outer circumference of said multilayer structural member.

11. The trap device for a vapor phase reaction apparatus of claim 1 wherein:

said multilayer structural member includes inner discs and outer discs.

12. The trap device for a vapor phase reaction apparatus of claim 1 wherein:

said multilayer structural member includes inner discs and outer discs; and said inner discs and said outer discs are arranged such that the inner discs and outer discs are present on the same horizontal plane.

13. The trap device for a vapor phase reaction apparatus of claim 1 wherein:

said multilayer structural member includes inner discs and outer discs; and said inner discs and said outer discs are arranged in staggered horizontal planes.

14. A trap device for a vapor phase reaction apparatus comprising:

a hermetically constructed enclosure vessel;

a multilayer structural member including a plurality of ring shaped plate members disposed in the enclosure vessel horizontally, the ring shaped plate members being disposed such that a plurality of ring shaped members are arranged in the vertical direction in a plurality of separate vertical columns, wherein said multilayer structural member is arranged so as to partition said enclosure vessel into an inner side space and an outer side space with respect to said ring shaped plate members;

a gas inlet section for introducing gas into the outer side space of said enclosure vessel partitioned by said multilayer structural member; and a gas outlet section for removing gas from the inner side space of said enclosure vessel partitioned by said multilayer structural member.

15. The trap device as set forth in claim 14, wherein said vertical columns of ring shaped members include a plurality of ring shaped members mounted on a rod to thereby form said vertical columns.

16. The trap device as set forth in claim 15, wherein said rod is fastened at the bottom of the enclosure vessel.

17. A trap device for a chemical vapor deposition apparatus, wherein the trap device removes reactive components from an exhaust gas flow, the trap device comprising:
- a hermetically constructed enclosure vessel for attaching to vacuum;
- a multilayer structural member including a plurality of ring shaped plate members disposed in the enclosure vessel horizontally, the ring shaped plate members being disposed such that a plurality of ring shaped members are disposed in the vertical direction and spaced apart such that the reactive components in the exhaust gas strike the ring shaped plate members and adhere thereto, wherein said multilayer structural member is arranged so as to partition said enclosure vessel into an inner side space and an outer side space with respect to said ring shaped plate members;
- a cooling means at the inner side space of said enclosure vessel;
- a gas inlet opening for introducing exhaust gas into the outer side space of said enclosure vessel partitioned by said multilayer structural member; and
- a gas outlet opening for removing gas from the inner side space of said enclosure vessel partitioned by said multilayer structural member, wherein said gas outlet seetitian is connected to vacuum.

* * * * *